United States Patent
Singer et al.

(10) Patent No.: US 9,255,702 B2
(45) Date of Patent: Feb. 9, 2016

(54) LED LIGHTING MODULE FOR VEHICLE HEADLIGHT

(75) Inventors: Frank Singer, Regenstauf (DE);
Thomas Haug, Ingolstadt (DE);
Alexander Sauerer, Munich (DE);
Hagen Luckner, Pentling (DE); Stefan Groetsch, Bad Abbach (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 95 days.

(21) Appl. No.: 13/700,047

(22) PCT Filed: Jun. 24, 2011

(86) PCT No.: PCT/EP2011/060647
§ 371 (c)(1),
(2), (4) Date: Feb. 6, 2013

(87) PCT Pub. No.: WO2012/016760
PCT Pub. Date: Feb. 9, 2012

(65) Prior Publication Data
US 2013/0135883 A1    May 30, 2013

(30) Foreign Application Priority Data

Aug. 2, 2010 (GB) .......................... 10 2010 033 092

(51) Int. Cl.
*F21S 4/00* (2006.01)
*F21V 29/00* (2015.01)
*H05K 1/02* (2006.01)
*H05K 3/00* (2006.01)
*B60Q 1/04* (2006.01)
*F21V 19/00* (2006.01)
*F21S 8/10* (2006.01)
(Continued)

(52) U.S. Cl.
CPC . *F21V 29/22* (2013.01); *B60Q 1/04* (2013.01); *F21S 48/115* (2013.01); *F21V 19/004* (2013.01); *H05K 1/0203* (2013.01); *H05K 3/0061* (2013.01); *F21S 48/1104* (2013.01); *H01L 33/641* (2013.01); *H01L 2224/48091* (2013.01); *H05K 1/0306* (2013.01); *H05K 1/142* (2013.01); *H05K 2201/09745* (2013.01); *H05K 2201/10106* (2013.01); *H05K 2201/10393* (2013.01); *H05K 2201/10409* (2013.01)

(58) Field of Classification Search
USPC .......... 362/545, 249.02, 249.06, 249.14, 294, 362/373, 396, 800
See application file for complete search history.

(56) References Cited

U.S. PATENT DOCUMENTS 6,448,642 B1    9/2002  Bewley et al.
7,290,913 B2 *  11/2007 Watanabe et al. ............. 362/545
(Continued)

FOREIGN PATENT DOCUMENTS

DE   10 2007 050 893 A1   4/2009
EP        2 131 101 A1   12/2009
(Continued)

*Primary Examiner* — Ismael Negron
(74) *Attorney, Agent, or Firm* — Slater & Matsil, L.L.P.

(57) ABSTRACT

A light emitting diode (LED) lightning module is disclosed. The LED lighting module includes a heat sink, a circuit board, a carrier, semiconductor chips such as LEDs arranged on an upper surface of the carrier, and at least one holding device pressing a lower surface of the substrate against an upper surface of the heat sink. The semiconductor chips are electrically connected to the carrier. The carrier is electrically connected to the circuit board.

17 Claims, 5 Drawing Sheets

(51) Int. Cl.
 *H01L 33/64* (2010.01)
 *H05K 1/03* (2006.01)
 *H05K 1/14* (2006.01)

(56) References Cited

U.S. PATENT DOCUMENTS

| | | | |
|---|---|---|---|
| 7,344,296 B2 * | 3/2008 | Matsui et al. | 362/652 |
| 7,728,231 B2 * | 6/2010 | Matsui et al. | 362/249.02 |
| 7,758,223 B2 * | 7/2010 | Osawa et al. | 362/547 |
| 8,038,329 B2 * | 10/2011 | Takahasi et al. | 362/373 |
| 8,072,130 B2 * | 12/2011 | Wang et al. | 362/294 |
| 8,360,606 B2 * | 1/2013 | Takei et al. | 362/249.01 |
| 8,449,154 B2 * | 5/2013 | Uemoto et al. | 362/430 |
| 8,500,316 B2 * | 8/2013 | Hisayasu et al. | 362/547 |
| 8,506,133 B2 * | 8/2013 | Tomiyoshi et al. | 362/363 |
| 8,602,593 B2 * | 12/2013 | Markle et al. | 362/249.02 |
| 2005/0207165 A1 | 9/2005 | Shimizu et al. | |
| 2007/0007558 A1 * | 1/2007 | Mazzochette | 257/239 |
| 2008/0008427 A1 | 1/2008 | Takeda et al. | |
| 2008/0303050 A1 * | 12/2008 | Lin | 257/99 |
| 2008/0315214 A1 | 12/2008 | Wall, Jr. et al. | |
| 2008/0315219 A1 | 12/2008 | Ho | |
| 2010/0181891 A1 | 7/2010 | Lee et al. | |
| 2010/0302777 A1 | 12/2010 | Knoll et al. | |

FOREIGN PATENT DOCUMENTS

| | | |
|---|---|---|
| WO | WO 2008/084878 A1 | 7/2008 |
| WO | WO 2009/034349 A2 | 3/2009 |

\* cited by examiner

LED LIGHTING MODULE FOR VEHICLE HEADLIGHT

This patent application is a national phase filing under section 371 of PCT/EP2011/060647, filed Jun. 24, 2011, which claims the priority of German patent application 10 2010 033 092.2, filed Aug. 2, 2010, each of which is incorporated herein by reference in its entirety.

TECHNICAL FIELD

An optoelectronic lighting module is specified. Furthermore, a motor vehicle headlight comprising such a lighting module is specified.

BACKGROUND

U.S. Patent Application Publication 2008/0008427 A1 specifies a light-emitting module and a lighting device for a vehicle.

SUMMARY OF THE INVENTION

In one aspect, the present invention specifies a lighting module having good heat dissipation.

In accordance with at least one embodiment of the optoelectronic lighting module, the latter comprises a heat sink having a heat sink top side. The heat sink serves, in particular, to dissipate waste heat that arises during the operation of the lighting module from the lighting module. By way of example, the heat sink is based on a metal such as copper or aluminum or a metal alloy or consists thereof. Preferably, an average thermal conductivity of the heat sink is at least 200 W/(m K). A heat capacity of the heat sink is, in particular, at least 100 J/K or at least 200 J/K.

In accordance with at least one embodiment of the lighting module, the latter comprises at least one circuit board. The circuit board is, for example, a metal-core circuit board or a printed circuit board. The circuit board is preferably fitted to the heat sink top side in a mechanically fixed fashion, for example by adhesive bonding. In particular, electrical contact is made with the lighting module via the circuit board. For this purpose, electrical contact regions can be fitted to a circuit board top side facing away from the heat sink top side.

In accordance with at least one embodiment of the lighting module, the latter comprises a carrier having a carrier top side and a carrier underside opposite the latter. The carrier comprises or is based, for example, on a ceramic such as AlN or a semiconductor material such as Si.

In accordance with at least one embodiment of the lighting module, the latter comprises one or more optoelectronic semiconductor chips. The semiconductor chips are, in particular, light-emitting diodes comprising, for example, a semiconductor layer sequence based on a III-V semiconductor material such as GaN. The semiconductor chips are preferably designed to generate ultraviolet or near-infrared radiation and/or blue light or white light during the operation of the lighting module. The semiconductor chips are fitted to the carrier top side and electrically connected to the carrier. For this purpose, electrical conductor tracks can be applied to the carrier top side. The semiconductor chips are, for example, electrically connected in series or in parallel.

In accordance with at least one embodiment of the lighting module, the latter comprises at least one holding device, which bears at least indirectly at the carrier top side and presses the carrier underside onto the heat sink top side. In other words, the holding device exerts a mechanical force on the carrier with the semiconductor chips, as a result of which the carrier is pressed onto the heat sink. In particular, the holding device and/or a part of the holding device which is in contact with the carrier is elastically deformable. The holding device is, for example, a spring or comprises such a spring.

In accordance with at least one embodiment of the lighting module, the carrier is electrically connected to the circuit board. The electrical connection between the circuit board and the carrier is preferably not effected via the heat sink. An electrical connection between the circuit board and the carrier can be electrically insulated from the heat sink.

In accordance with at least one embodiment of the lighting module, the holding device is electrically insulated from the one or the plurality of semiconductor chips. There is then no direct electrical connection between the holding device and the at least one semiconductor chip. That is to say that the holding device is different from electrical connection devices for the semiconductor chip. In particular, the holding device serves exclusively for mechanical and optionally thermal contact-connection of the carrier to the heat sink.

According to at least one embodiment of the optoelectronic lighting module, the latter comprises a heat sink having a heat sink top side, and a circuit board and a carrier having a carrier top side and a carrier underside opposite the latter. One or a plurality of optoelectronic semiconductor chips is or are fitted to the carrier top side. The semiconductor chips are electrically connected to the carrier. One or a plurality of holding devices of the lighting module bear indirectly or directly at the carrier top side and press the carrier underside onto the heat sink top side. The carrier is electrically connected to the circuit board. The holding device is electrically insulated from the at least one semiconductor chip.

By virtue of the fact that the carrier is pressed onto the heat sink by the holding device, it is possible to dispense with a connecting means for mechanically fixing the carrier to the heat sink, wherein the connecting means is fitted between the carrier and the heat sink. A thermal resistance between the semiconductor chips and the heat sink can be reduced as a result.

In accordance with at least one embodiment of the lighting module, the carrier on which the semiconductor chips are fitted is spaced apart from the circuit board in a lateral direction. A gap is thus formed between the carrier and the circuit board, as seen in a plan view of the heat sink top side. Preferably, said gap extends all around the circuit board, such that the carrier and the circuit board do not touch anywhere in a lateral direction. As an alternative thereto, it is likewise possible for the carrier and the circuit board to touch each other directly in places in a lateral direction. By way of example it is possible for the gap to extend along the circuit board only at two or three sides and for the circuit board to bear against the carrier at one or at two sides.

In accordance with at least one embodiment of the lighting module, the carrier and the circuit board are electrically connected to one another via an electrical bridge. The bridge connects electrical conductor tracks at the carrier top side to corresponding electrical conductor tracks at a circuit board top side. It is possible for the bridge to span the gap possibly present between the carrier and the circuit board. By way of example, the bridge is formed by a bonding wire, by an electrically conductive tape or by a layer or a layer sequence of electrically conductive and optionally electrically insulating layers which are applied directly to the carrier top side and to the circuit board top side.

In accordance with at least one embodiment of the lighting module, the circuit board has an opening that completely penetrates through the circuit board. The opening is preferably surrounded at at least three sides or at at least four sides by a material of the circuit board in a lateral direction. In other words, the circuit board can surround the carrier all around in a lateral direction. The carrier with the at least one semiconductor chip can be situated in the opening, wherein the carrier preferably at least in places projects beyond the circuit board in a direction away from the heat sink.

In accordance with at least one embodiment of the lighting module, the holding device that presses the carrier onto the heat sink is not in contact with the circuit board. Therefore, the circuit board and the holding device do not touch each other in that case. This makes it possible to ensure a good heat transfer from the carrier or the semiconductor chips directly to the heat sink without a detour via the circuit board.

In accordance with at least one embodiment of the lighting module, the holding device presses the carrier onto the heat sink top side, in use as intended, with a mechanical force of between 5 N and 100 N inclusive, in particular with a force of between 20 N and 60 N inclusive. Additionally or alternatively, an average pressing pressure of the carrier underside onto the heat sink top side is between 0.2 MPa and 20 MPa inclusive, in particular between 0.4 MPa and 2 MPa inclusive.

In accordance with at least one embodiment of the lighting module, the carrier underside and/or the heat sink top side have/has a mean roughness, also designated as $R_a$, of at most 10 µm or of at most 5 µm or of at most 2 µm. In other words, the carrier underside and/or the heat sink top side are smooth. This makes it possible to ensure a good thermal contact between the carrier and the heat sink.

In accordance with at least one embodiment of the lighting module, the carrier underside and/or the heat sink top side are shaped in a planar and level fashion, particularly those regions of the heat sink top side on which the carrier bears. In other words, no targeted two-dimensional or three-dimensional structuring of the carrier underside and of those regions of the heat sink top side on which the carrier bears is performed. The carrier and the heat sink can therefore bear flatly against one another.

In accordance with at least one embodiment of the lighting module, the carrier underside is in direct contact with the heat sink top side in places or completely. The carrier and the heat sink can therefore touch each other. Without taking account of a microscopic roughness of the carrier underside and of the heat sink top side, the carrier underside preferably touches the heat sink top side over the whole area. A particularly low thermal resistance between the carrier and the heat sink can thereby be obtained.

In accordance with at least one embodiment of the lighting module, an intermediate layer is situated between the carrier underside and the heat sink top side in places or over the whole area. The intermediate layer is designed for improving the thermal coupling of the carrier to the heat sink. In particular, the intermediate layer is suitable for filling gaps between the carrier and the heat sink which are caused by a microscopic roughness of the carrier underside and/or of the heat sink top side. In other words, a contact area between the carrier and the heat sink can be enlarged by means of the intermediate layer. An average thickness of the intermediate layer is preferably at most 10 µm or at most 2.5 µm or at most 1 µm. In other words, the intermediate layer is made comparatively thin and therefore does not constitute a significant thermal resistance. Specifically, the intermediate layer reduces a thermal resistance between the carrier and the heat sink in comparison with an equivalent arrangement without the intermediate layer. By way of example, the intermediate layer comprises a silicone or consists thereof.

In accordance with at least one embodiment of the lighting module, the heat sink has a trough or a groove at the heat sink top side. The carrier with the semiconductor chips is fitted in the trough or groove, wherein the carrier preferably projects beyond the trough or the groove in a direction away from a trough base. The trough base is configured in a level fashion, in particular. The carrier can bear flatly and in a level fashion on the trough base. By means of the trough, the carrier is guidable and/or fixable in a lateral direction relative to the heat sink.

In accordance with at least one embodiment of the lighting module, the holding device is configured as a spring or as tape or comprises at least one of these elements, for example in conjunction with a fixing element such as a screw or a rivet or a soldering contact. A material of the holding device preferably has a specific thermal conductivity of at least 80 W/(K m). By way of example, the holding device comprises copper or a copper alloy or consists thereof.

In accordance with at least one embodiment of the lighting module, the holding device is in direct thermal contact with the heat sink in places. By way of example, the holding device is then in places forced or pressed onto a boundary area of the heat sink such as the heat sink top side. If the holding device has a plurality of parts, then preferably at least one of the parts is thermally contact-connected both directly to the carrier and directly to the heat sink. By way of example, the corresponding part of the holding device touches the carrier top side and/or the heat sink top side.

In accordance with at least one embodiment of the lighting module, the average coefficients of thermal expansion of the circuit board and/or of the heat sink differ from a coefficient of thermal expansion of the carrier by at most a factor of 4 or by at most a factor of 3. Material stresses on account of different thermal expansions can thereby be reduced, as a result of which a lifetime of the lighting module can be increased.

In accordance with at least one embodiment of the lighting module, the latter comprises at least one stop. The stop is fitted to at least one side area of the carrier. Preferably, the stop is in indirect or direct contact with the heat sink top side and the carrier. The stop is designed to prevent or reduce a lateral displacement of the carrier relative to the heat sink top side. The stop is, for example, a fixed point for the carrier relative to the heat sink. In particular, the stop is situated at most at one or at two side areas of the carrier, wherein the side areas at which the stop is situated are preferably not opposite one another.

In accordance with at least one embodiment of the lighting module, the holding device is fixed to the heat sink permanently and, in use of the lighting module as intended, not reversibly releasably. By way of example, the holding device is adhesively bonded or soldered to the heat sink.

Furthermore, a motor vehicle headlight is specified. The motor vehicle headlight comprises at least one optoelectronic lighting module as described in conjunction with one or more of the embodiments mentioned above. Therefore, features of the motor vehicle headlight are also disclosed for the lighting module described here, and vice versa.

BRIEF DESCRIPTION OF THE DRAWINGS

An optoelectronic lighting module described here and a motor vehicle headlight described here are explained in greater detail below on the basis of exemplary embodiments with reference to the drawings. In this case, identical reference signs specify identical elements in the individual figures. In this case, however, relationships to scale are not illustrated.

rather, individual elements may be illustrated with an exaggerated size in order to afford a better understanding.

DETAILED DESCRIPTION OF ILLUSTRATIVE EMBODIMENTS

Figure 1:
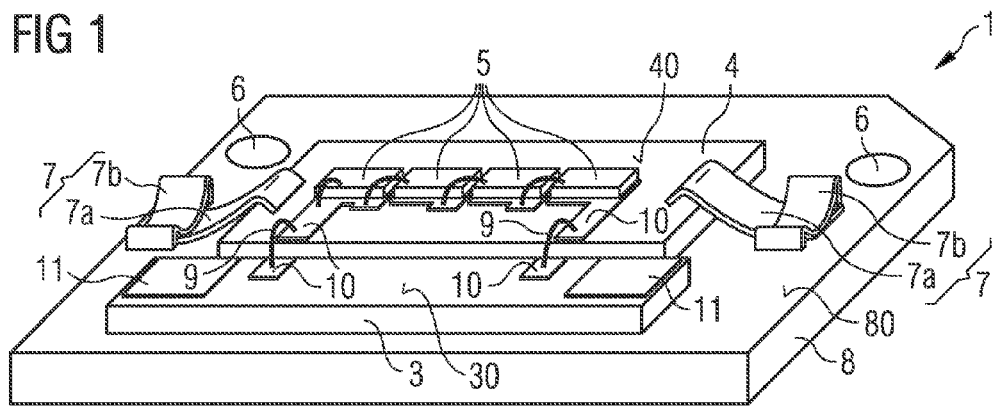
FIGS. 1 to 6 show schematic illustrations of exemplary embodiments of optoelectronic lighting modules described here.

FIG. 1 shows a perspective illustration of an exemplary embodiment of an optoelectronic lighting module 1. By way of example, the lighting module 1 is incorporated in a motor vehicle headlight. The lighting module 1 comprises a heat sink 8 having a heat sink top side 80. A circuit board 3, for example a metal-core circuit board, is situated in a manner fixedly mounted at the heat sink top side 80. Furthermore, two holding devices 7 and a carrier 4 with a plurality of optoelectronic semiconductor chips 5 are fitted to the heat sink top side 80.

Electrical conductor tracks 10 are situated both at a carrier top side 40 facing away from the heat sink 8 and at a circuit board top side 30 facing away from the heat sink 8, which electrical conductor tracks can be buried in part in particular in the circuit board 3. An electrical connection between the conductor tracks 10 of the carrier 4 and of the circuit board 3 is effected via electrical bridges 9, which are realized, for example, by bonding wires.

Furthermore, the semiconductor chips 5 are electrically connected in series via the conductor tracks 10 at the carrier top side 40. In contrast to the illustration, it is likewise possible for the semiconductor chips 5 to be drivable individually or in groups individually. In this case, more conductor tracks 10 than illustrated in FIG. 1 run both at the circuit board 3 and at the carrier 4. Likewise, more than two bridges 9 for electrical connection between the carrier 4 and the circuit board 3 are preferably present in this case. For external electrical contact-connection, soldering pads 11 are provided at the circuit board 3 in corner regions.

The holding devices 7 in each case have two parts 7a, 7b. The part 7a is configured as a spring clip, which presses directly onto the carrier top side 40 and which is directly in contact with the heat sink top side 80. The part 7a is permanently pressed and fixed onto the heat sink top side 80 by the part 7b. By means of the holding devices 7, the carrier 4 is pressed onto the heat sink top side 80 in a manner free of connecting means. The carrier 4 and the heat sink 8 are in direct contact with one another, without a connecting means being situated between the heat sink top side 80 and a carrier underside.

Optionally, the heat sink 8 has fixing devices 6 by means of which the entire lighting module 1 can be fixed to an external mounting plate. The fixing devices 6 are, for example, holes for receiving screws.

A thickness of the carrier is, for example, between 200 μm and 1 mm inclusive, in particular between 300 μm and 700 μm inclusive. Lateral dimensions of the carrier 4 are, for example, between 3 mm×5 mm and 5 mm×8 mm inclusive if the lighting module 1 comprises a plurality of semiconductor chips 5, or between 1 mm×4 mm and 3 mm×5 mm inclusive if the lighting module comprises only a single semiconductor chip 5, in contrast to the illustration in FIG. 1. By way of example, in operation of the lighting module 1 as intended, a waste heat of at least 3 W arises per semiconductor chip 5.

The carrier 4 comprises, for example, a ceramic such as aluminum nitride or aluminum oxide or consists of such a ceramic. It is likewise possible for the carrier 4 to comprise silicon nitride or silicon carbide or to consist thereof, or for the carrier 4 to be produced from a semiconductor material such as silicon or germanium. If the carrier 4 comprises an electrically conductive material, then the latter is preferably provided, at least in places, with a thin passivation layer, for example composed of silicon nitride, which has only a negligible thermal resistance.

Suitable materials for the carrier 4 having a high thermal conductivity and a thermal expansion similar to that of the semiconductor chip such as ceramics typically have a coefficient of thermal expansion of approximately $5 \times 10^{-6}$ K$^{-1}$. Metals for the heat sink such as aluminum or copper, by contrast, have a comparatively high coefficient of thermal expansion in the range of approximately $15 \times 10^{-6}$ K$^{-1}$ to approximately $25 \times 10^{-6}$ K$^{-1}$. A connecting means between the carrier 4 and the heat sink 8, as an alternative to the configurations in accordance with the exemplary embodiments described here, must be able to compensate for the differences in the coefficient of thermal expansion, since otherwise the carrier can be detached from the heat sink after the lighting module has been switched on and switched off many times.

Rigid metallic solders or, for example, epoxides admixed with silver as connecting means are generally not able to compensate for the stresses on account of the different thermal expansions between the carrier and the heat sink. For this purpose, comparatively soft adhesives, in particular based on a silicone, are necessary, which are filled with barium nitride, for example. However, such adhesives have a comparatively low thermal conductivity of the order of magnitude of 2 W/(m K) and, moreover, are to be applied with relatively large layer thicknesses of between 20 μm and 60 μm. As a result of the high thermal resistance of the connecting means layer, the heat dissipation capacity of the lighting module is thus significantly reduced. By virtue of the fact that, in the lighting module 1 described here, the carrier 4 is pressed by means of the holding devices 7a, 7b on the heat sink 8 directly and in a manner free of connecting means, a thermal resistance between the heat sink 8 and the carrier 4 is reduced. By way of example, the thermal resistance is at most 2.5 K/W or at most 2.0 K/W.

Figure 2A:
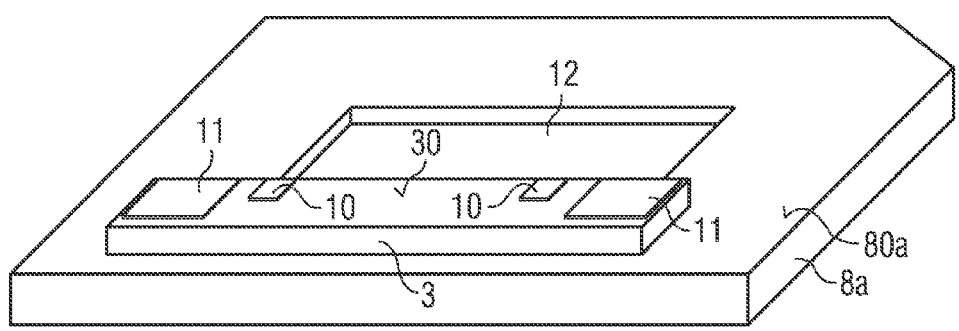
Figure 2B:
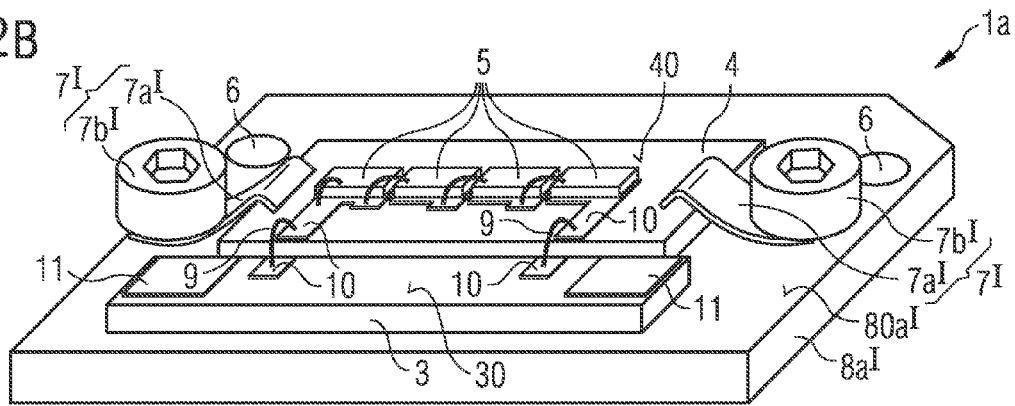

In the exemplary embodiment in accordance with FIG. 2, which includes FIGS. 2A and 2B, the heat sink $8a$, $8a^I$ has a trough 12 for receiving the carrier 4 at the heat sink top side $80a$, $80a^I$ as shown in FIG. 2A. The trough 12 fixes the carrier 4, for example, with a tolerance of at most 50 μm or of at most 25 μm, in a lateral direction relative to the heat sink $8a^I$.

In contrast to the exemplary embodiment in accordance with FIG. 1, the holding device $7^I$ is fixed to the heat sink $8a^I$ reversibly. The parts $7b^I$ are formed by screws which press the parts $7a^I$ onto the heat sink top side $80a^I$ and onto the carrier top side 40. As also in all the other exemplary embodiments, the holding devices $7^I$ preferably serve only for mechanical and optionally for thermal linking of the carrier 4 to the heat sink $8a^I$. The holding devices $7^I$ are electrically insulated from the conductor tracks 10 and from the semiconductor chips 5. By virtue of the fact that the mechanical and the electrical linking of the carrier 4 are separated from one another, in particular the holding device $7^I$ can be designed comparatively freely.

Figure 3:
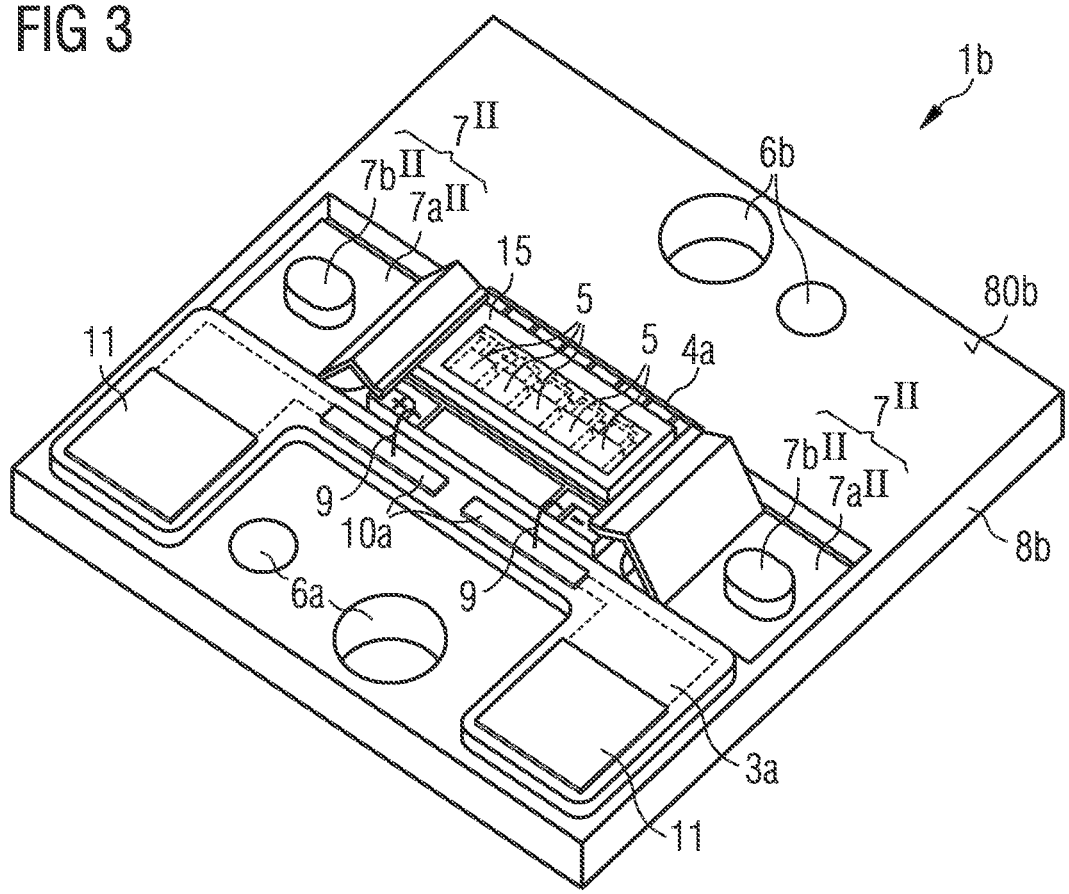

In the further exemplary embodiment of the lighting module $1b$ in accordance with FIG. 3, the parts $7b^{II}$ of the holding devices are likewise formed by reversibly operable screws. The parts $7a^{II}$ extend over at least 80% of short sides of the carrier $4a$, as seen in a plan view of the heat sink top side $80b$. The circuit board $3a$ is situated only over half of the heat sink top side 80b. In contrast to the illustration, it is likewise possible for the circuit board 3a to completely enclose the carrier 4a all around or to extend at least along two or three sides of the carrier 4a. As also in all the other exemplary embodiments, the semiconductor chips 5 are optionally covered by a radiation-transmissive covering 15, wherein an optical unit (not illustrated in the figures) can be disposed downstream of the covering 15. The heat sink 8b may include fixing devices 6a, 6b.

Figure 4A:
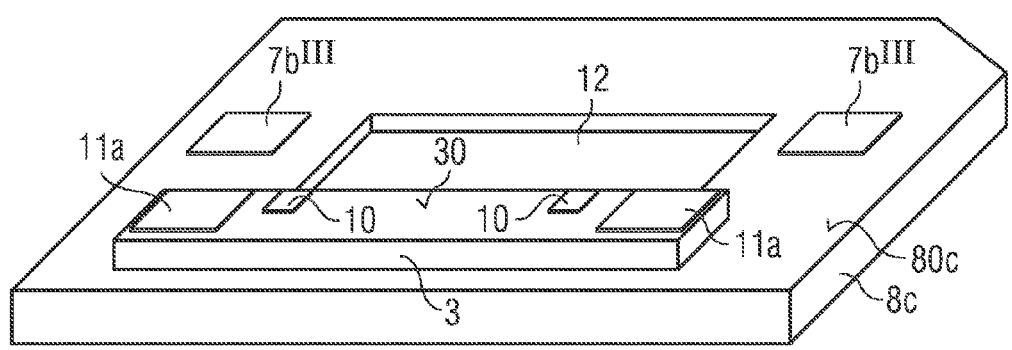
Figure 4B:
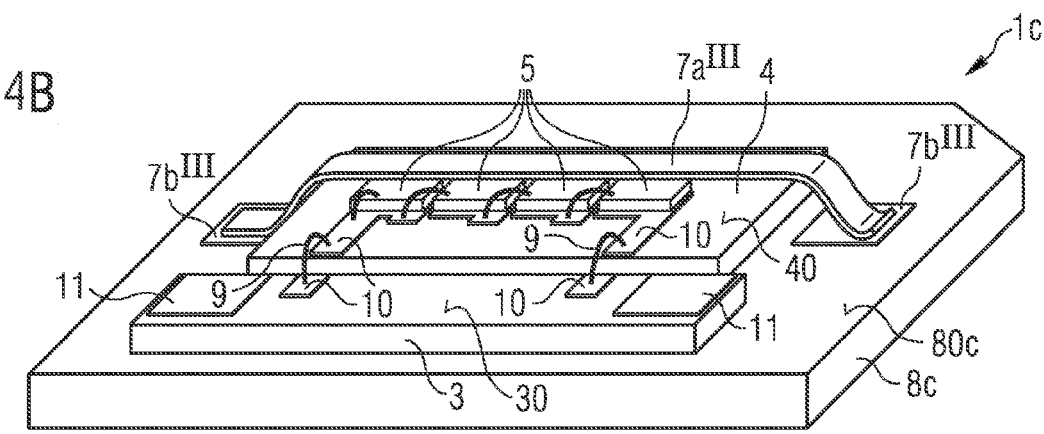

In the exemplary embodiment in accordance with FIG. 4, which includes FIGS. 4A and 4B, the carrier 4 is situated in the trough 12 and projects beyond the latter. The parts $7b^{III}$ of the fixing device are formed by soldering contact areas. The carrier 4 is pressed onto the heat sink 8c by means of the part $7a^{III}$, which is a tape, for example composed of copper or a copper alloy. The part $7a^{III}$ is fixed with the parts $7b^{III}$ by means of a soldering connection or by means of an adhesive-bonding connection. By way of example, the tape has a thickness of between 100 µm and 300 µm inclusive. Furthermore, the part $7a^{III}$ extends along the entire carrier 4 and covers, for example, at least 15% or at least 20% of the carrier top side 40.

Figure 5A:
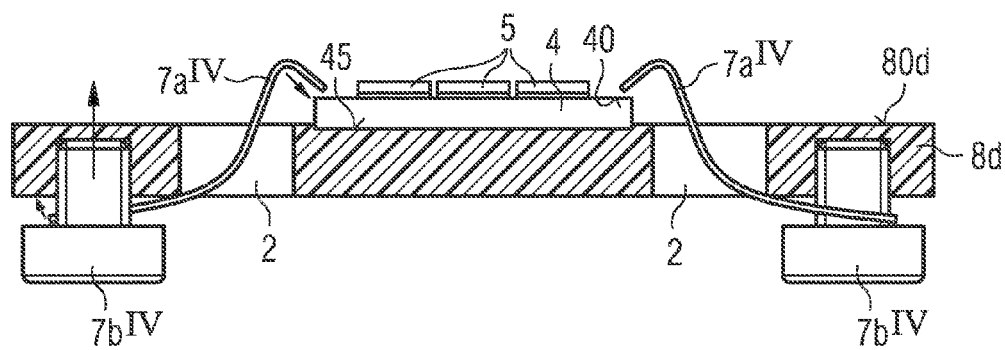
Figure 5B:
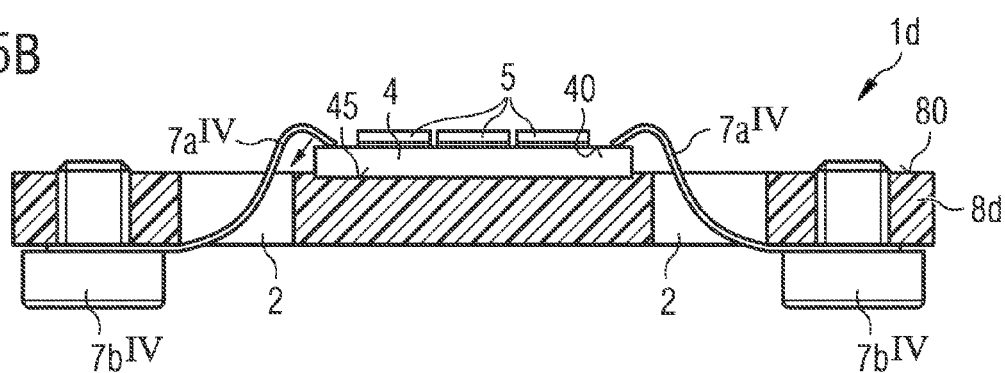

FIG. 5, which includes FIGS. 5A and 5B, illustrates a further exemplary embodiment of the lighting module 1d, in FIG. 5A before the fixing of the carrier 4 and in FIG. 5B after the carrier 4 has been pressed onto the heat sink 8d. The parts $7a^{IV}$ of the holding device are formed by clips extending through openings 2 from a rear side of the heat sink 8d to the carrier top side 40. The parts $7b^{IV}$ are formed by screws. By tightening the screwing of the parts $7b^{IV}$, the clip-like parts $7a^{IV}$ are pressed onto the carrier top side 40, as a result of which the carrier 4 with the semiconductor chips 5 is fixed.

Figure 6:
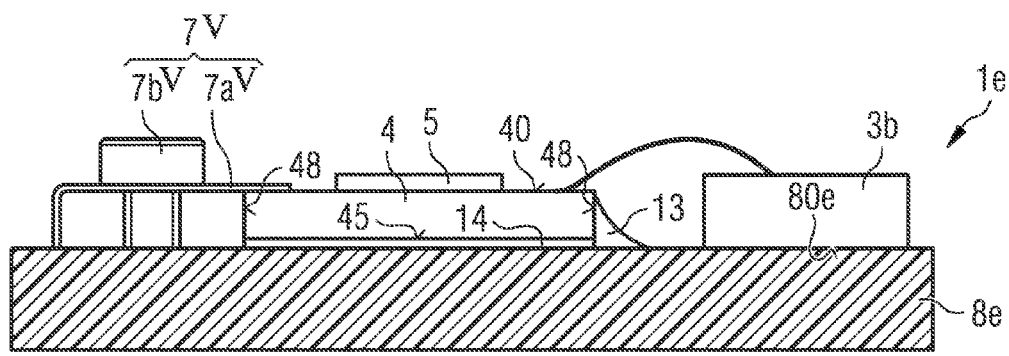

In the exemplary embodiment of the lighting module 1e in accordance with FIG. 6, an intermediate layer 14 is situated between the carrier underside 45 and the heat sink top side 80e. The intermediate lay 14 has a small thickness of, for example, at most 1 µm. In comparison with the carrier 4 being directly pressed onto the heat sink 8e, the intermediate layer 14 reduces a thermal resistance between the carrier 4 and the heat sink 8e, since a roughness of the heat sink top side 80e and of the carrier underside 45 can be compensated for by the intermediate layer 14.

The intermediate layer 14 does not serve for mechanically fixing the carrier 4. The holding devices $7^V$ are used for this purpose, only a single one of which is illustrated by way of example in FIG. 6. The part $7a^V$ of the holding device $7^V$ is configured as a clip, one end of which bears at the carrier top side 40 and the other end of which is supported at the heat sink top side 80e, wherein the latter end is oriented substantially perpendicularly to the heat sink top side 80e. The part $7a^V$ is pressed onto the carrier top side 40 by means of the part $7b^V$, which is shaped as a screw, for example.

Optionally, as also in all the other exemplary embodiments, it is possible for a stop 13 to be fitted at side areas 48 of the carrier 4 in a punctiform manner or in the form of a line. In particular slipping of the carrier 4 before or during pressing by the holding devices $7^V$ can be avoided or reduced by means of the stop 13. By way of example, the stop 13 is formed by a comparatively soft silicone that compensates for thermal expansions. It is likewise possible for the stop 13 to be formed by one or a plurality of soldering points, for example.

Preferably, the stop 13 extends only on one or only on two side areas 48 of the carrier 4. In accordance with FIG. 6, the stop 13 is applied to the heat sink 8e after the carrier 4 and the stop 13 is shaped approximately triangularly in cross section and is directly adjacent to the side area 48 and to the heat sink top side 80e. As an alternative thereto, it is possible for the stop 13 to be formed by a structuring of the heat sink top side 80e or by a piece of material fixed to the heat sink 8e before the carrier 4, for example also by the circuit board 3b itself—in contrast to the illustration in the figures.

Figure 7A:
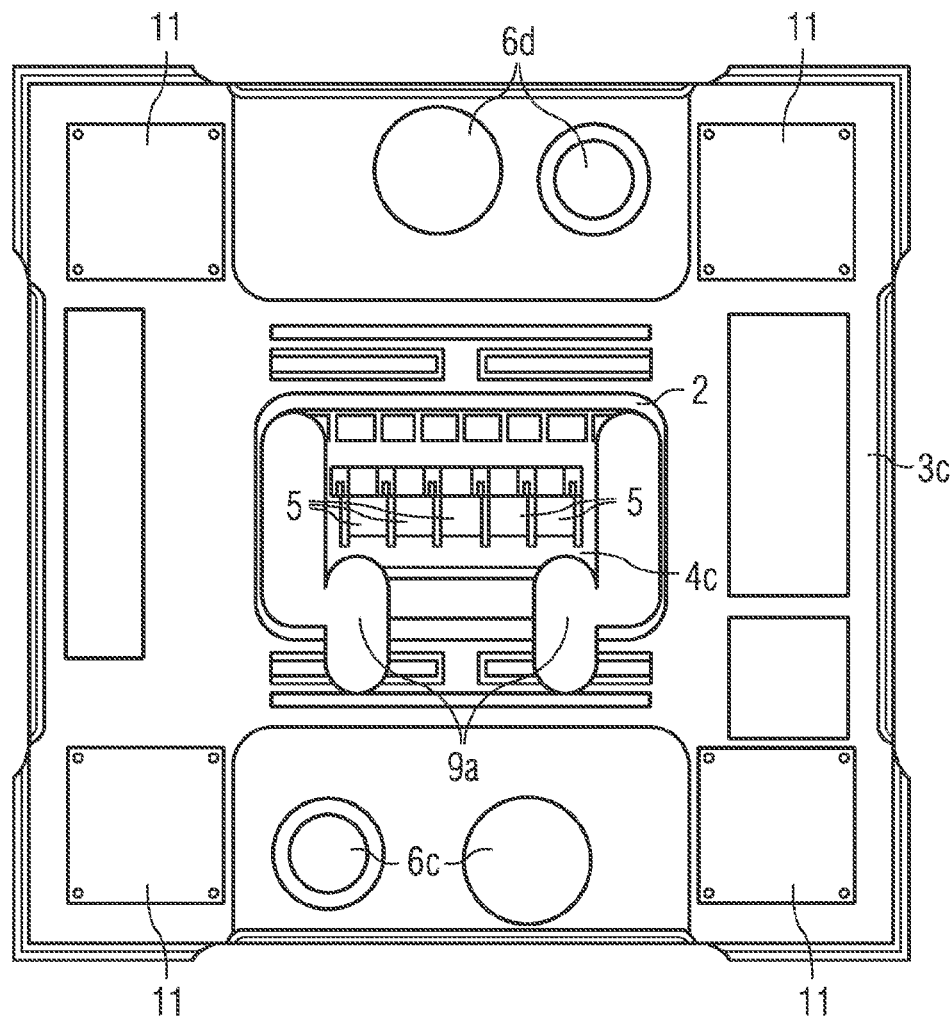
FIG. 7 shows a schematic illustration of a modification of a lighting module.
Figure 7B:
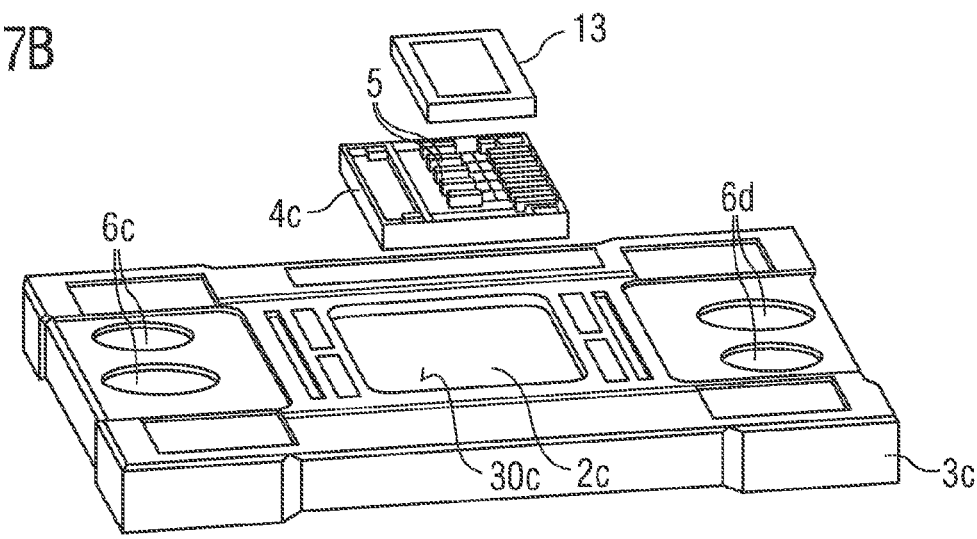

A modification of a lighting module can be seen in the plan view in FIG. 7A and in the perspective illustration in FIG. 7B. The light module may include fixing devices 6c, 6d. The carrier 4c with the semiconductor chip 5 is adhesively bonded onto the circuit board top side 30c in the opening 2c of the circuit board 3c by means of a connecting means layer. The opening 2c does not completely penetrate through the circuit board 3c, which comprises a comparatively thick metallic core, with the result that a trough is formed, in which the carrier 4c is fitted. A mechanical connection between the carrier 4c and the circuit board 3c is effected substantially only via the connecting means layer. Since the connecting means layer lies between the circuit board 3c and the carrier 4c, a thermal resistance is increased in comparison with the exemplary embodiments in accordance with FIGS. 1 to 6.

The invention described here is not restricted by the description on the basis of the exemplary embodiments. Rather, the invention encompasses any novel feature and also any combination of features, which in particular includes any combination of features in the patent claims, even if this feature or this combination itself is not explicitly specified in the patent claims or the exemplary embodiments.

The invention claimed is:

1. An optoelectronic lighting module comprising:
 a heat sink having a heat sink top side;
 a circuit board having a circuit board top side;
 a carrier having a carrier top side and a carrier underside opposite the carrier top side, the carrier comprises a ceramic or a semiconductor material;
 optoelectronic semiconductor chips fitted to the carrier top side and electrically connected to the carrier; and
 a holding device, which bears at least indirectly at the carrier top side and presses the carrier underside to the heat sink top side, wherein the carrier is electrically connected to the circuit board and the holding device is electrically insulated from the semiconductor chip,
 wherein the carrier and the circuit board are arranged on the heat sink top side,
 wherein the holding device comprises clips extending through openings from a rear side of the heat sink to the carrier top side and further screws, and
 wherein the screws are tightened so that the clips are pressed onto the carrier top side thereby fixing the carrier with optoelectronic semiconductor chips.

2. The optoelectronic lighting module according to claim 1, wherein the carrier is spaced apart from the circuit board in a lateral direction and a gap between the carrier and the circuit board is spanned by an electrical bridge.

3. The optoelectronic lighting module according to claim 2, wherein the carrier comprises electrical conductor tracks and wherein the circuit board comprises electrical conductor tracks, and wherein the bridge connects electrical conductor tracks of the carrier and the electrical conductor tracks of the circuit board.

4. The optoelectronic lighting module according to claim 1, wherein the holding device presses the carrier onto the heat sink top side with a mechanical force of between 5 N and 100 N inclusive and with an average pressure of between 0.2 MPa and 20 MPa inclusive.

5. The optoelectronic lighting module according to claim 1, wherein the carrier underside and the heat sink top side each have a mean roughness of at most 10 µm.

6. The optoelectronic lighting module according to claim 1, wherein the carrier underside is in direct contact with the heat sink top side at least in places.

7. The optoelectronic lighting module according to claim 1, wherein the holding device is configured as a spring or as tape and is shaped from a material having a thermal conductivity of at least 80 W/(K·m).

8. The optoelectronic lighting module according to claim 1, wherein the holding device is in direct thermal contact with the heat sink in places.

9. The optoelectronic lighting module according to claim 1, wherein an average coefficient of thermal expansion of the circuit board and of the heat sink differs from an average coefficient of thermal expansion of the carrier at most by a factor of 4.

10. The optoelectronic lighting module according to claim 1, further comprising a stop fitted to at least one side area of the carrier, the stop being in contact with the heat sink top side, wherein the stop is designed to prevent or reduce a lateral displacement of the carrier relative to the heat sink top side.

11. The optoelectronic lighting module according to claim 1, further comprising an intermediate layer for improving thermal coupling of the carrier to the heat sink, the intermediate layer being situated between the carrier underside and the heat sink top side at least in places.

12. The optoelectronic lighting module according to claim 11, wherein an average thickness of the intermediate layer is at most 10 μm.

13. The optoelectronic lighting module according to claim 1, wherein the heat sink has a trough and wherein the carrier is fitted in the trough.

14. The optoelectronic lighting module according to claim 13, wherein the carrier projects beyond the trough.

15. An optoelectronic lighting module comprising:
a heat sink having a heat sink top side;
a circuit board having a circuit board top side, wherein the circuit board comprises electrical conductor tracks;
a carrier having a carrier top side and a carrier underside opposite the carrier top side, wherein the carrier comprises electrical conductor tracks;
at least one optoelectronic semiconductor chip, which is fitted to the carrier top side and is electrically connected to the carrier; and
at least one holding device, which bears directly at the carrier top side and presses the carrier underside to the heat sink top side,
wherein the carrier is electrically connected to the circuit board and the holding device is electrically insulated from the at least one optoelectronic semiconductor chip,
wherein the carrier is spaced apart from the circuit board in a lateral direction parallel to the heat sink top side and a gap between the carrier and the circuit board is spanned by an electrical bridge,
wherein the heat sink top side is shaped in a planar and level fashion and the carrier and the circuit board are arranged in a common plane parallel to the heat sink top side,
wherein the electrical bridge connects the electrical conductor tracks of the carrier and the electrical conductor tracks of the circuit board,
wherein the holding device is configured as a spring or as a tape, and
wherein the holding device is shaped from a material having a thermal conductivity of at least 80 W/(K·m).

16. The optoelectronic lighting module according to claim 15, wherein the carrier comprises a ceramic or a semiconductor material.

17. The optoelectronic lighting module according to claim 16, wherein a thickness of the carrier is between 200 μm and 1 mm inclusive.

* * * * *